(12) United States Patent
Zheng et al.

(10) Patent No.: US 8,971,133 B1
(45) Date of Patent: Mar. 3, 2015

(54) MEMORY DEVICE AND METHOD OF OPERATION OF SUCH A MEMORY DEVICE

(71) Applicant: ARM Limited, Cambridge (GB)

(72) Inventors: Bo Zheng, San Jose, CA (US); Jungtae Kwon, San Jose, CA (US); Gus Yeung, Austin, TX (US); Yew Keong Chong, New Braunsfel, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/037,413

(22) Filed: Sep. 26, 2013

(51) Int. Cl.
*G11C 7/10* (2006.01)
*G11C 7/22* (2006.01)
*G11C 7/12* (2006.01)
*G06F 17/50* (2006.01)

(52) U.S. Cl.
CPC ............... *G11C 7/12* (2013.01); *G06F 17/505* (2013.01); *G06F 2217/78* (2013.01)
USPC ............ 365/189.05; 365/230.08; 365/189.02; 365/185.25; 365/194

(58) Field of Classification Search
CPC ...... G11C 7/1051; G11C 7/1078; G11C 7/22; G11C 7/106; G11C 7/1057
USPC ............. 365/189.05, 230.08, 189.02, 185.25, 365/194
See application file for complete search history.

(56) References Cited

U.S. PATENT DOCUMENTS 7,830,735 B2 * 11/2010 Ware et al. ............... 365/194

OTHER PUBLICATIONS

A. Raychowdhury et al, "PVT-and-Aging Adaptive Wordline Boosting for 8T SRAM Power Reduction" 2010 IEEE International Solid-State Circuits Conference, Feb. 2010, 3 pages.
K. Koo et al, "A New Level-Up Shifter for High Speed and Wide Range Interface in Ultra Deep Sub-Micron" IEEE, 2005, pp. 1063-1065.
K. Zhang et al, "A 3-GHz 70Mb SRAM in 65nm CMOS Technology with Integrated Column-Based Dynamic Power Supply" 2005 IEEE International Solid-State Circuits Conference, Feb. 2005, 3 pages.
M. Khellah et al, "A 4.2GHz 0.3mm$^2$ 256kb Dual-V$_{cc}$ SRAM Building Block in 65nm CMOS" 2006 IEEE International Solid-State Circuits Conference, Feb. 2006, 10 pages.

(Continued)

*Primary Examiner* — Jason Lappas
(74) *Attorney, Agent, or Firm* — Nixon & Vanderhye P.C.

(57) ABSTRACT

A memory device having an array of memory cells connected to a core voltage level, and access circuitry used to perform a write operation in order to write data into a plurality of addressed memory cells. At least one bit line associated with at least each column in the array containing an addressed memory cell is precharged to the peripheral voltage level prior to the write operation being performed. Word line driver circuitry is then configured to assert a word line signal at the core voltage level on the word line associated with the row of the array containing the addressed memory cells. Write multiplexing driver circuitry asserts a mux control signal to write multiplexing circuitry which then couples the bit line of each addressed memory cell to the write driver circuitry in dependence on the mux control signal identifying which column contains the addressed memory cells.

19 Claims, 9 Drawing Sheets

(56) References Cited

OTHER PUBLICATIONS

Y.H. Chen et al, "A 0.6V 45nm Adaptive Dual-rail SRAM Compiler Circuit Design for Lower VDD_min VLSIs" 2008 Symposium on VLSI Circuits Digest of Technical Papers, 2008, pp. 210-211.

H. Pilo et al, "A 64Mb SRAM in 22nm SOI Technology Featuring Fine-Granularity Power Gating and Low-Energy Power-Supply-Partition Techniques for 37% Leakage Reduction" 2013 IEEE International Solid-State Circuits Conference, Feb. 2013, 3 pages.

* cited by examiner

MEMORY DEVICE AND METHOD OF OPERATION OF SUCH A MEMORY DEVICE

BACKGROUND OF THE INVENTION

1. Field of the Invention

The present invention relates to a memory device and to a method of operation of such a memory device, and in particular to a mechanism for operating such a memory device when the access circuitry used to access the array of memory cells is operated from a peripheral voltage domain with a supply voltage less than the supply voltage in a core voltage domain used by the array of memory cells.

2. Description of the Prior Art

In modern data processing systems, it is becoming more and more common for certain parts of the data processing system to operate in a different voltage domain to one or more other parts. For example, a trend within integrated circuits is the increasingly common use of embedded memory, such as SRAM memory. With the reduction in size of process geometries, the individual memory cells within the memory are becoming less stable. To reduce the power consumption of the integrated circuit, it is desirable to reduce the operating voltage of the components within the integrated circuit. However, whilst this can be done for many of the components within the integrated circuit, including access logic circuitry associated with the memory device, it is often the case that a higher voltage is needed to drive the array of memory cells within the memory device in order to enhance the stability of those cells. Hence, embedded SRAM bit cells may use a higher voltage supply (providing a core voltage level) to guarantee state retention, whilst the rest of the system, including the access logic circuitry employed to access those bit cells within the memory device, may use a lower voltage supply (providing a peripheral voltage level) to reduce power consumption. In order to maintain performance, and reduce switching power, a level shifting mechanism is needed to pass signals between these different voltage domains.

FIG. 1 is a block diagram schematically illustrating a known memory device 10 where the access logic circuitry 20 of the memory device is provided in a first voltage domain operating with a first voltage supply providing a peripheral voltage level VDDP and a ground voltage level (not shown), whilst the array of bit cells 30 is provided in a second voltage domain operating with a second voltage supply providing a core voltage level VDDC and the ground voltage level. The core voltage level VDDC is higher than the peripheral voltage level VDDP. This enables the access logic circuitry 20 to operate with a reduced power consumption, whilst the array of bit cells 30 is operated at a voltage level sufficient to guarantee state retention.

The access logic circuitry 20 will receive a number of control signals over path 55, these control signals identifying write transactions, read transactions, the addresses of those transactions, etc. It will also receive over path 60 write data for write transactions to be performed within the array of bit cells 30, and will output over path 75 the read data resulting from read transactions performed within the array of bit cells 30. As will be understood by those skilled in the art, the access logic circuitry 20 will include a number of components, such as address latches, various stages of word line decoding circuitry to decode the address in order to generate appropriate word line enable signals to activate addressed rows within the array of bit cells 30, write data path logic circuits used to control the voltages on the bit lines within the array of bit cells during a write operation, and various read data path logic circuits for processing the data read out of the array of bit cells in response to a read operation. Accordingly, for write operations, a number of signals will be generated for issuing to the array of bit cells 30 (these signals being schematically illustrated by the arrow 65 in FIG. 1). In one known prior art approach, these signals are subjected to a level up shifting function 40 in order to convert the voltage of those signals from the lower voltage domain to the higher voltage domain. Similarly, any data read out from the bit cells 30 over path 70 is subjected to a level down shifting function 50 in order to convert the voltage levels from the higher (core) voltage domain to the lower (peripheral) voltage domain, before those signals are then subsequently processed by the access logic circuitry 20.

The level up shifting mechanism 40 is generally more problematic to implement than the level down shifting mechanism 50 (in fact in many instances no specific level down shifting circuitry may be required), since when performing level up shifting there is the potential for establishing various DC paths that can result in significant power consumption, and which may potentially create short circuit current paths.

When the voltage difference between the core voltage domain and the peripheral voltage domain is relatively small (for example up to 250 mV) it is not always necessary to level shift all of the control signals routed from the access logic circuitry to the bit cells, and read and write operations performed in respect of the bit cells will still operate correctly. However, in modern systems the voltage difference between the core voltage domain and the peripheral voltage domain is getting larger, and may for example be in the range of 400 mV. With such a large difference in the voltage domains, it has been found that level shifting of the control signals is required in order to ensure correct operation of the bit cells within the array when performing read and write operations. In particular, it has been found that the write margin can be insufficient unless such level shifting has been performed. Accordingly, when the difference between the core voltage domain and the peripheral voltage domain is of the order of 400 mV, it is known to perform level shifting on all of the control signals provided from the access logic circuitry to the bit cells. Whilst this ensures correct operation, it has a significant impact on the overall power consumption of the memory device.

Accordingly, it would be desirable to provide a memory device which operates correctly when the voltage difference between the core voltage domain and the peripheral voltage domain is relatively large (e.g. of the order of 400 mV), but with a reduced power consumption compared with the known prior art approach.

SUMMARY OF THE INVENTION

Viewed from a first aspect, the present invention provides a memory device comprising: an array of memory cells connected to a core voltage level and arranged as a plurality of rows and columns, each row being connected to an associated word line, and each column being connected to an associated at least one bit line, the columns being arranged into a plurality of column groups, each column group containing a plurality of columns; access circuitry configured to perform a write operation in order to write data into a plurality of addressed memory cells, said plurality of addressed memory cells comprising an addressed memory cell within each of a plurality of the column groups, the access circuitry being configured to receive both the core voltage level and a peripheral voltage level less than said core voltage level; the access circuitry comprising: word line driver circuitry configured to assert a word line signal at the core voltage level on the word line associated with a row of the array containing the plurality of addressed memory cells; precharge circuitry configured to precharge, to said peripheral voltage level, the at least one bit line associated with at least each column containing an addressed memory cell, prior to said write operation being performed; write driver circuitry configured to control the voltage on the at least one bit line of each of the addressed memory cells during the write operation in order to store write data into the plurality of addressed memory cells; write multiplexing circuitry configured, during the write operation, to couple the at least one bit line of each addressed memory cell to the write driver circuitry, in dependence on a mux control signal identifying which column in each of said plurality of column groups contains the addressed memory cells; and write multiplexing driver circuitry configured to assert said mux control signal to the write multiplexing circuitry at said core voltage level.

In accordance with the present invention, the access circuitry is configured to receive both the core voltage level and the peripheral voltage level. Word line driver circuitry within the access circuitry is arranged to assert a word line signal at the core voltage level in order to activate a row containing the addressed memory cells for a write operation, and in addition write multiplexing driver circuitry asserts the required mux control signal(s) to write multiplexing circuitry at the core voltage level in order to cause the relevant components within the write multiplexing circuitry to couple the required columns of the array to the write driver circuitry. However, the precharge circuitry precharges the bit lines to the peripheral voltage level prior to the write operation being performed.

By this approach, and in particular by asserting the word line signal and the mux control signal at the core voltage level, it has been found that sufficient write margin can be achieved to ensure write operations are performed correctly, even when the difference between the core voltage domain and the peripheral voltage domain is relatively large, for example 400 mV. However, since other control signals are retained at the peripheral voltage level, the overall power consumption of the memory device can be significantly reduced. For example, since the precharge circuitry precharges the bit lines only to the peripheral voltage level, rather than to the core voltage level, the power consumption associated with the discharging of certain bit lines during a write operation, and the subsequent precharging of those discharged bit lines back up to the peripheral voltage level prior to the next access operation, is significantly reduced.

In one particular embodiment, the word line driver circuitry and the write multiplexing driver circuitry are the only components within the access circuitry that are configured to operate from the core voltage level, and all of the remaining components operate from the peripheral voltage level. This optimises the power consumption benefits achievable, whilst ensuring sufficient write margin is maintained.

There are a number of ways in which the mux control signal can be asserted at the core voltage level by the write multiplexing driver circuitry. In one embodiment, the write multiplexing driver circuitry includes level shifting circuitry used to convert at least one signal from the peripheral voltage level to the core voltage level in order to cause the asserted mux control signal to be at the core voltage level. Hence, in this embodiment, dedicated level shifting circuitry is provided within the write multiplexing driver circuitry, in addition to the components required to perform the write multiplexing driver function.

The at least one signal whose voltage level is converted by the level shifting circuitry can vary dependent on embodiment. However, in one embodiment the level shifting circuitry operates on at least one input signal to the write multiplexing driver circuitry in order to generate a corresponding at least one level shifted input signal, and the write multiplexing driver circuitry is configured to then generate the asserted mux control signal in dependence on said at least one level shifted input signal. In one particular embodiment, all of the input signals to the write multiplexing driver circuitry are subjected to this level shifting operation, and accordingly the functional components performing the write multiplexing driver operation within the write multiplexing driver circuitry operate entirely on input signals within the core voltage domain.

Whilst in one embodiment the above-described dedicated level shifting circuits are used, such level shifting circuits occupy a relatively large area, and consume additional power to perform their level shifting operations. In an alternative embodiment, the requirement for such separate level shifting circuits can be avoided by instead applying a P/N skew to the transistors forming at least one of the components within the write multiplexing driver circuitry. In particular, in one embodiment, the write multiplexing driver circuitry comprises at least one circuit component formed of both NMOS transistors and PMOS transistors, and a drive strength of one of the NMOS transistors and the PMOS transistors is skewed so as to enable the write multiplexing driver circuitry to level shift at least one signal from the peripheral voltage level to the core voltage level in order to cause the asserted mux control signal to be at the core voltage level. Whilst the shifting range available from such a P/N skewing process is not as large as that available when using dedicated level shifting circuitry, it has been found that it can still provide a sufficient level shifting range to accommodate a 400 mV difference between the peripheral voltage domain and the core voltage domain, and accordingly can be used in order to reduce the area and power consumption associated with dedicated level shifting circuits.

In one particular embodiment, the write multiplexing driver circuitry includes a NAND circuit component and a P/N skew is incorporated within the NAND circuit component to increase the drive strength of the NMOS transistors relative to the PMOS transistors.

The above described options for constructing the write multiplexing driver circuitry also apply when constructing the word line driver circuitry used to assert the word line signal at the core voltage level. In particular, such word line driver circuitry may incorporate dedicated level shifting circuits, or can provide P/N skew within the transistors of one or more components of the word line driver circuitry in order to achieve the required shift in the voltage level from the peripheral voltage domain to the core voltage domain.

The write multiplexing circuitry can be constructed in a variety of ways. However, in one embodiment the write multiplexing circuitry comprises, for each column group, switch circuitry configured to couple to the write driver circuitry the at least one bit line associated with one column in that column group. Hence, one column in each column group is coupled to the write driver circuitry, the column selected being the column that contains the addressed memory cell.

The switch circuitry can take a variety of forms, but in one embodiment comprises a switch element for each column within the column group, and the mux control signal generated by the write multiplexing driver circuitry comprises a separate mux control signal for each switch element, with one of the separate mux control signals being asserted at the core voltage level to turn on the associated switch element.

The individual switch elements can take a variety of forms. In one embodiment, they are formed by an NMOS transistor circuit whose gate is driven by the appropriate mux control signal. In an alternative embodiment, a transmission gate structure can be used including an NMOS transistor and a PMOS transistor placed back to back, with the input signal provided to the gate of the NMOS transistor being inverted prior to provision to the gate of the PMOS transistor.

In one embodiment, operation of the precharge circuitry and the write driver circuitry is controlled by associated control signals switchable between a ground voltage level and said peripheral voltage level. Hence, the power consumption associated with these circuits is significantly reduced, when compared with driving those circuits using control signals that vary between the ground voltage level and the core voltage level.

Whilst each column may comprise a single bit line, in one embodiment each column is connected to a pair of bit lines. In that embodiment, the write driver circuitry may be configured to control the voltage on the pair of bit lines of each of the addressed memory cells during the write operation by maintaining one of the bit lines in said pair at the peripheral voltage level and discharging the voltage on the other of the bit lines in said pair. Since the bit lines are precharged to the peripheral voltage level, the power consumption involved in discharging one of the bit lines during the write operation is significantly reduced, when compared with an approach where the bit lines were precharged to the core voltage level. Further, the power consumption involved in subsequently precharging the discharged bit line is also reduced.

In addition to performing write operations, the access circuitry may also perform read operations in order to read data from a plurality of addressed memory cells. For the read operation the word line driver circuitry and the precharge circuitry operate in the same manner as for the write operation. However, to support read operations, the access circuitry further comprises: sense amplifier circuitry configured to determine the data stored in the addressed memory cells by monitoring the voltage on the at least one bit line of each of the addressed memory cells during the read operation; read multiplexing circuitry configured, during the read operation, to couple the at least one bit line of each addressed memory cell to the sense amplifier circuitry, in dependence on a read mux control signal identifying which column in each of said plurality of column groups contains the addressed memory cells; and read multiplexing driver circuitry configured to assert said read mux control signal to the read multiplexing circuitry at said peripheral voltage level.

In contrast to the write multiplexing driver circuitry, it should be noted that the read multiplexing driver circuitry asserts the read mux control signal at the peripheral voltage level. Further, since the bit lines are precharged to the peripheral voltage level, the data as sensed by the sense amplifier circuitry can be returned as read data to the peripheral voltage domain without any level down shifting being required.

In one embodiment, operation of the precharge circuitry and the sense amplifier circuitry is controlled by associated control signals switchable between a ground voltage level and said peripheral voltage level, thereby reducing power consumption in those components when compared with a situation where the control signals are in the core voltage domain.

Viewed from a second aspect, the present invention provides a method of operating a memory device to perform a write operation, the memory device comprising an array of memory cells connected to a core voltage level and arranged as a plurality of rows and columns, each row being connected to an associated word line, and each column being connected to an associated at least one bit line, the columns being arranged into a plurality of column groups, each column group containing a plurality of columns, the method comprising: employing access circuitry to perform the write operation in order to write data into a plurality of addressed memory cells, said plurality of addressed memory cells comprising an addressed memory cell within each of a plurality of the column groups, the access circuitry receiving both the core voltage level and a peripheral voltage level less than said core voltage level; precharging, to said peripheral voltage level, the at least one bit line associated with at least each column containing an addressed memory cell, prior to said write operation being performed; during the write operation causing the access circuitry to: assert a word line signal at the core voltage level on the word line associated with a row of the array containing the plurality of addressed memory cells; employ write driver circuitry to control the voltage on the at least one bit line of each of the addressed memory cells in order to store write data into the plurality of addressed memory cells; couple the at least one bit line of each addressed memory cell to the write driver circuitry, in dependence on a mux control signal identifying which column in each of said plurality of column groups contains the addressed memory cells; and assert said mux control signal to the write multiplexing circuitry at said core voltage level.

Viewed from a third aspect, the present invention provides a memory device comprising: an array of memory cell means connected to a core voltage level and arranged as a plurality of rows and columns, each row being connected to an associated word line means, and each column being connected to an associated at least one bit line means, the columns being arranged into a plurality of column groups, each column group containing a plurality of columns; access means for performing a write operation in order to write data into a plurality of addressed memory cell means, said plurality of addressed memory cell means comprising an addressed memory cell means within each of a plurality of the column groups, the access means for receiving both the core voltage level and a peripheral voltage level less than said core voltage level; the access means comprising: word line driver means for asserting a word line signal at the core voltage level on the word line means associated with a row of the array containing the plurality of addressed memory cell means; precharge means for precharging, to said peripheral voltage level, the at least one bit line means associated with at least each column containing an addressed memory cell means, prior to said write operation being performed; write driver means for controlling the voltage on the at least one bit line means of each of the addressed memory cell means during the write operation in order to store write data into the plurality of addressed memory cell means; write multiplexing means for coupling, during the write operation, the at least one bit line means of each addressed memory cell means to the write driver means, in dependence on a mux control signal identifying which column in each of said plurality of column groups contains the addressed memory cell means; and write multiplexing driver means for asserting said mux control signal to the write multiplexing means at said core voltage level.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
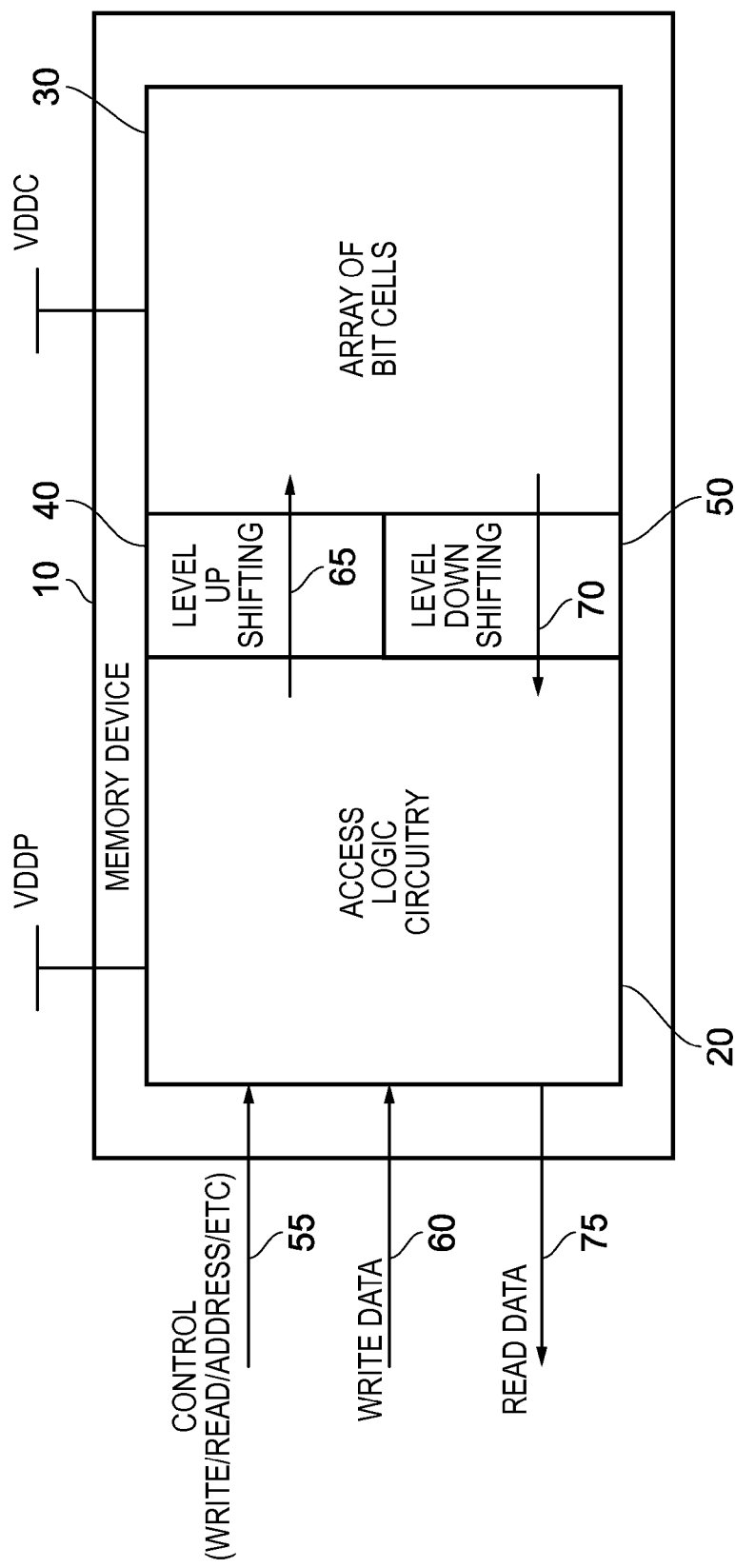
FIG. 1 is a diagram schematically illustrating a known memory device where the array of bit cells operate from a core voltage domain and the access logic circuitry operates from a peripheral voltage domain.
Figure 2:
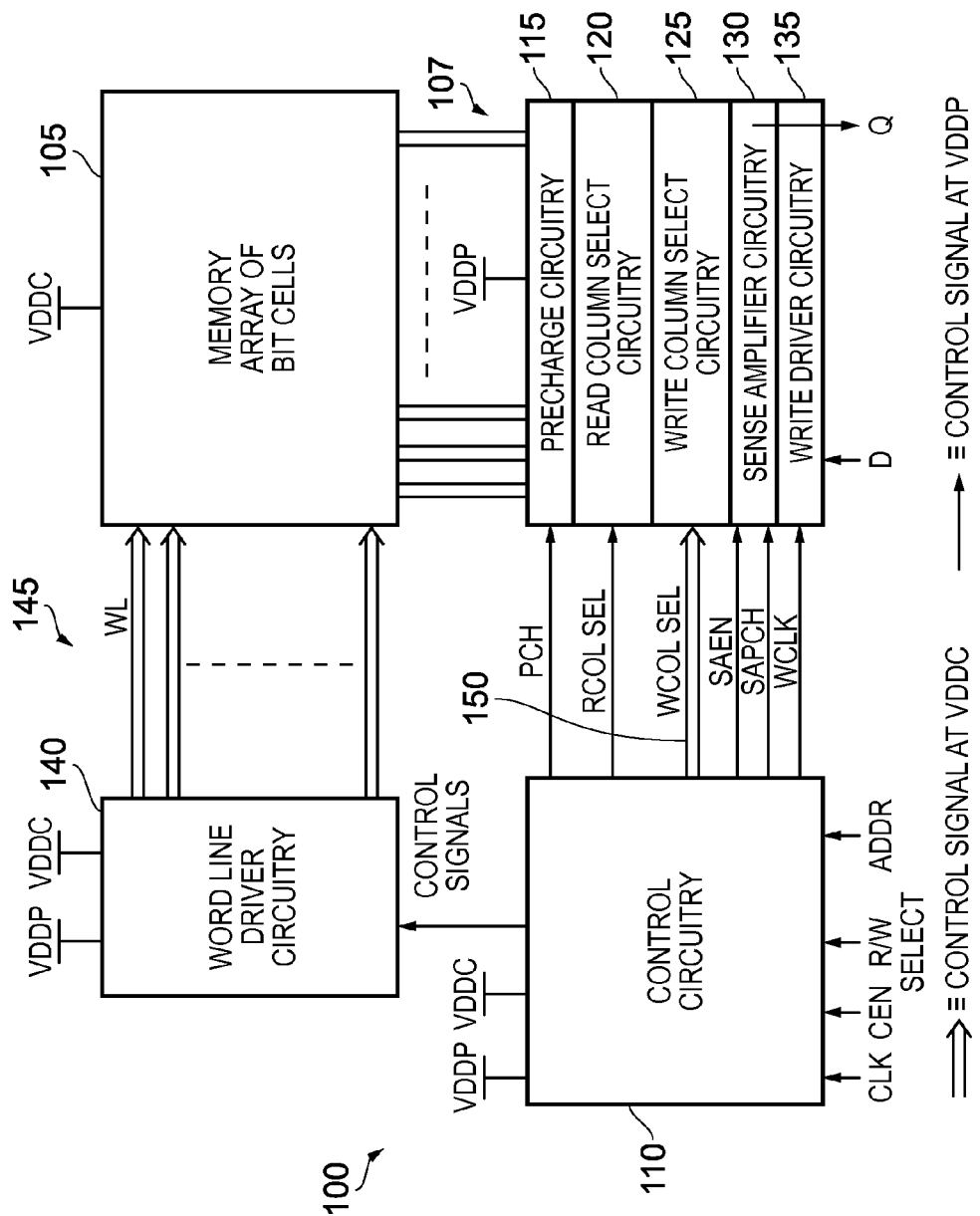
FIG. 2 schematically illustrates a memory device in accordance with one embodiment.

FIG. 2 is a diagram schematically illustrating a logical arrangement of a memory device in accordance with one embodiment. In particular, the memory device 100 includes a memory array 105 comprising an array of memory cells arranged in a plurality of rows and columns. A plurality of word lines 145 are provided through the array in order to allow individual rows of memory cells to be addressed by the word line driver circuitry 140 during write and read operations. In addition, a plurality of bit lines are provided in association with the columns of memory cells, in this embodiment each column having an associated pair of bit lines, to enable data to be written into an addressed memory cell of that column during a write operation, and for data to be read from an addressed memory cell of that column during a read operation.

Precharge circuitry 115 is used to precharge the voltage level on the bit lines under the control of control circuitry 110. Following the precharge operation, a write operation or a read operation can be performed.

The various columns of memory cells within the memory array are arranged to form a plurality of column groups, with each column group containing a plurality of columns. When a particular word line is activated during an access operation in order to activate a row of memory cells, the control circuitry 110 also issues a column select signal to the read column select circuitry 120 in the event of a read operation or to the write column select circuitry in the event of a write operation. The column select signal causes the appropriate column select circuitry to select one column within each of the column groups, the selected column being the column containing the addressed memory cell. For a read operation, the read column select circuitry 120 causes the bit lines of each selected column to be connected to the sense amplifier circuitry 130, whilst for a write operation, the write column select circuitry 125 causes the bit lines of each selected column to be connected to the write driver circuitry 135.

For a write operation, the control circuitry 110 will issue appropriate control signals to the word line driver circuitry 140 in order to cause a particular row of memory cells to be activated via the associated word line, and will also issue a write column select signal (in practice this is a collection of separate write column select signals) to the write column select circuitry 125 to cause one column from each column group to be selected, as a result of which the bit lines coupled to each addressed memory cell will then be coupled to the write driver circuitry 135. The control circuitry 110 will also issue a write clock signal to the write driver circuitry 135 to cause the write driver circuitry 135 to control the voltages on the relevant bit line pairs, in order to cause the required data values to be written into the addressed memory cells. In particular, whilst the precharge circuitry will have precharged each bit line pair to a logic one level, during the write operation the write driver circuitry will selectively discharge one of the bit lines for each bit line pair connected to an addressed memory cell, in order to write the required data value into that addressed memory cell.

For a read operation, the control circuitry 110 will issue a control signal to the word line driver circuitry 140 in order to cause a particular row of memory cells to be activated via the appropriate word line, and the control circuitry 110 will issue a read column select signal (in practice a collection of signals) to the read column select circuitry 120 to cause one column in each column group to have its bit lines coupled to the sense amplifier circuitry 130. The control circuitry 110 will also issue one or more control signals to the sense amplifier circuitry 130 in order to control the sense amplifier circuitry to evaluate the voltages on the relevant bit lines, with the sensed data then being output as the read data. In particular, whilst the bit lines will have been precharged to the logic one level, during the read operation one of the bit lines in the bit line pair of each addressed memory cell will discharge towards the logic zero level, and at some point during that discharge process, the sense amplifier circuitry 130 will be activated to sense the difference in voltage between the bit lines, and hence detect the data values stored in the addressed memory cells.

As shown in FIG. 2, for each write operation or read operation to be performed, the control circuitry will receive a read/write select signal and an address used to determine which memory cells within the array should be written to, or read from. The control circuitry 110 also receives a clock signal and a clock enable signal to control operation of the circuitry.

In accordance with one embodiment, the memory array operates in a core voltage domain, and accordingly receives a core voltage level VDDC. However, the majority of the access circuitry formed by the other components shown in FIG. 2 operates in a peripheral voltage domain from a peripheral voltage level which is less than the core voltage level. In one particular embodiment, the peripheral voltage level is approximately 400 mV less than the core voltage level. As shown in FIG. 2, all of the various control signals generated by the control circuitry 110 and issued to the word line driver circuitry 140, the precharge circuitry 115, the read column select circuitry 120, the sense amplifier circuitry 130 and the write driver circuitry 135 are generated in the peripheral voltage domain. The precharge circuitry operates from the peripheral voltage supply, and accordingly precharges the bit lines to the peripheral voltage level VDDP prior to a read or a write operation.

However, the control circuitry 110 also receives the core voltage level VDDC, with that voltage level being used by write multiplexing driver circuitry within the control circuitry 110 such that the write column select signals over path 150 are issued in the core voltage domain. In one embodiment, when a particular write column select signal is asserted, it will be asserted at the core voltage level VDDC. Similarly, the word line driver circuitry also receives the core voltage supply VDDC, such that the driver circuits within the word line driver circuitry used to assert word line signals on the word lines 145 generate word line signals in the core voltage domain. In particular, for a read or a write operation, one of the word lines will be asserted by setting the voltage on that word line to the core voltage level VDDC.

It has been found that by asserting the required write column select signal 150 at the core voltage level and the required word line 145 at the core voltage level, but leaving all other control signals in the peripheral voltage domain, this ensures sufficient write margin during the performance of write operations, whilst avoiding unnecessary power consumption that would arise as a result of issuing any of the other control signals in the core voltage domain. A significant source of power consumption arises from the precharging of the bit lines prior to each write or read operation. Since the precharge circuitry 115 operates in the peripheral voltage domain, and precharges the bit lines to the peripheral voltage level, this consumes significantly less power than is required if those bit lines were to have to be precharged to the core voltage level VDDC. Further, less power consumption is subsequently consumed when those bit lines are selectively discharged during the write and read operations.

Figure 3:
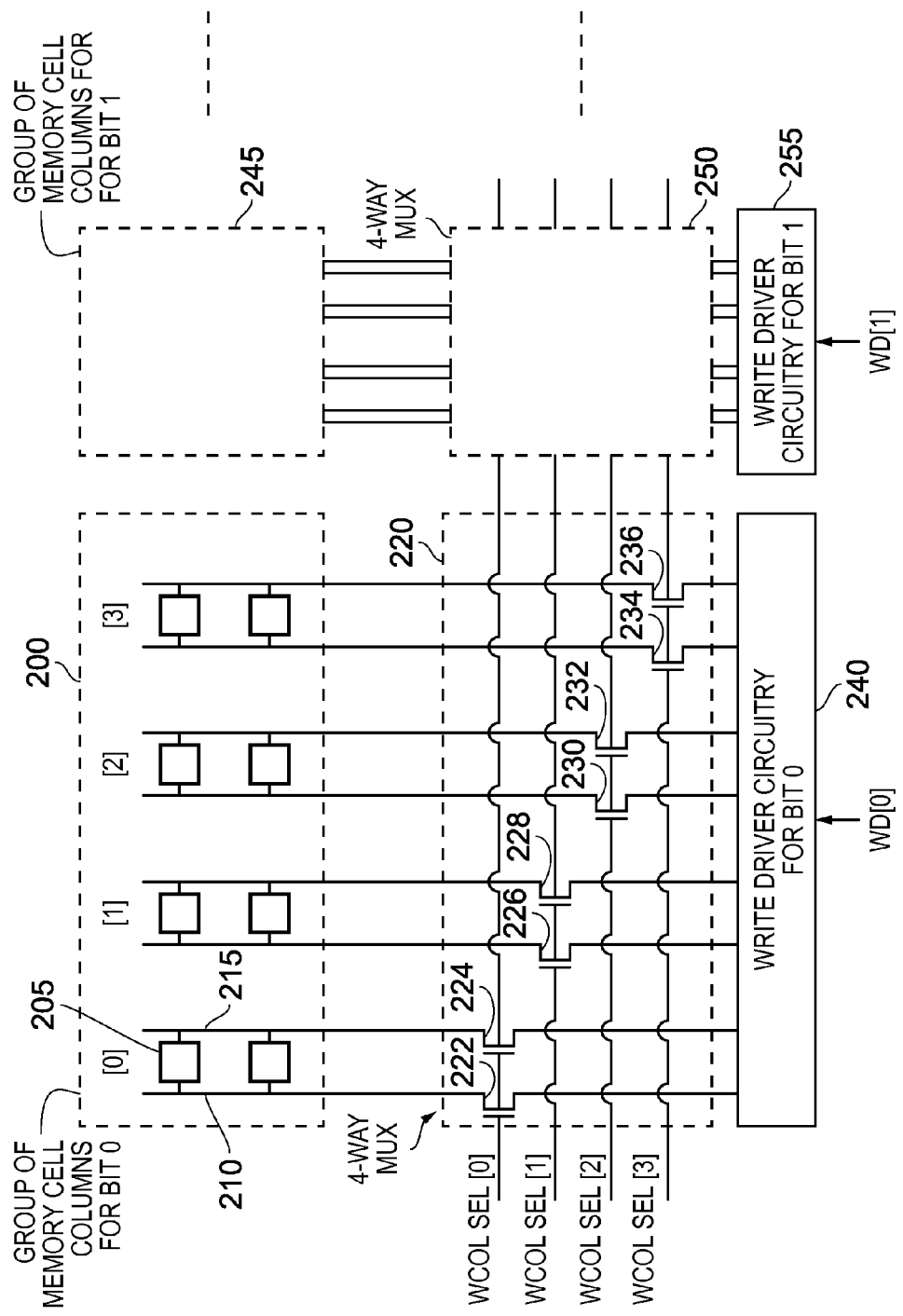
FIG. 3 schematically illustrates the operation of the write column select circuitry of FIG. 2 in accordance with one embodiment.

FIG. 3 schematically illustrates the operation of the write column select circuitry 125 in accordance with one embodiment. In particular, the write column select circuitry 125 comprises separate multiplexing circuits 220, 250 for each bit of a data value to be written into the memory array. In the example illustrated, it is assumed that the memory array is configured in a four-way multiplexing manner, such that each group of memory cell columns 200, 245 contains four columns of memory cells. Within any particular column, the various memory cells 205 are coupled between the associated bit line pair 210, 215. The write driver circuitry 135 then consists of separate write driver circuits for each bit value to be written into the memory cells, and hence in FIG. 3 there is shown write driver circuitry 240 for bit zero and write driver circuitry 255 for bit one. It will be appreciated that the general layout shown in FIG. 3 will then be replicated for each additional bit of the data value to be written.

Each multiplexing circuit 220, 250 comprises a plurality of switching elements, and in particular separate switching elements for each column. A separate write column select signal is then generated for each column, and hence in this example four write column select signals are generated. For any particular write operation, only one of the write column select signals will be asserted (in this example at a logic one level) whilst all of the other write column select signals will remain de-asserted.

In this embodiment, each switching element consists of a pair of NMOS transistors which receive the write column select signal at their gate, and accordingly, when the write column select signal is asserted, serve to connect the corresponding bit line pair to the write driver circuitry. Hence, as shown in FIG. 3 for the four way multiplexer 220, the switching element consisting of transistors 222, 224 is provided in association with a column zero, the switch element consisting of transistors 226, 228 is provided in association with column one, the switch element 230, 232 is provided in association with column two and the switch element consisting of transistors 234, 236 is provided in association with column three. This same structure of switching elements is then replicated in each of the other multiplexers 250.

Whilst in FIG. 3, each of the switching elements is shown as a pair of NMOS transistors, it will be appreciated that the switching elements can be constructed in a variety of ways. For example, in an alternative embodiment, each of the switching elements may be formed by a pair of transmission gates, each transmission gate comprising an NMOS transistor placed back to back with a PMOS transistor, with the NMOS transistor receiving the write column select signal and the PMOS transistor receiving an inverted version of that write column select signal.

Figure 4:
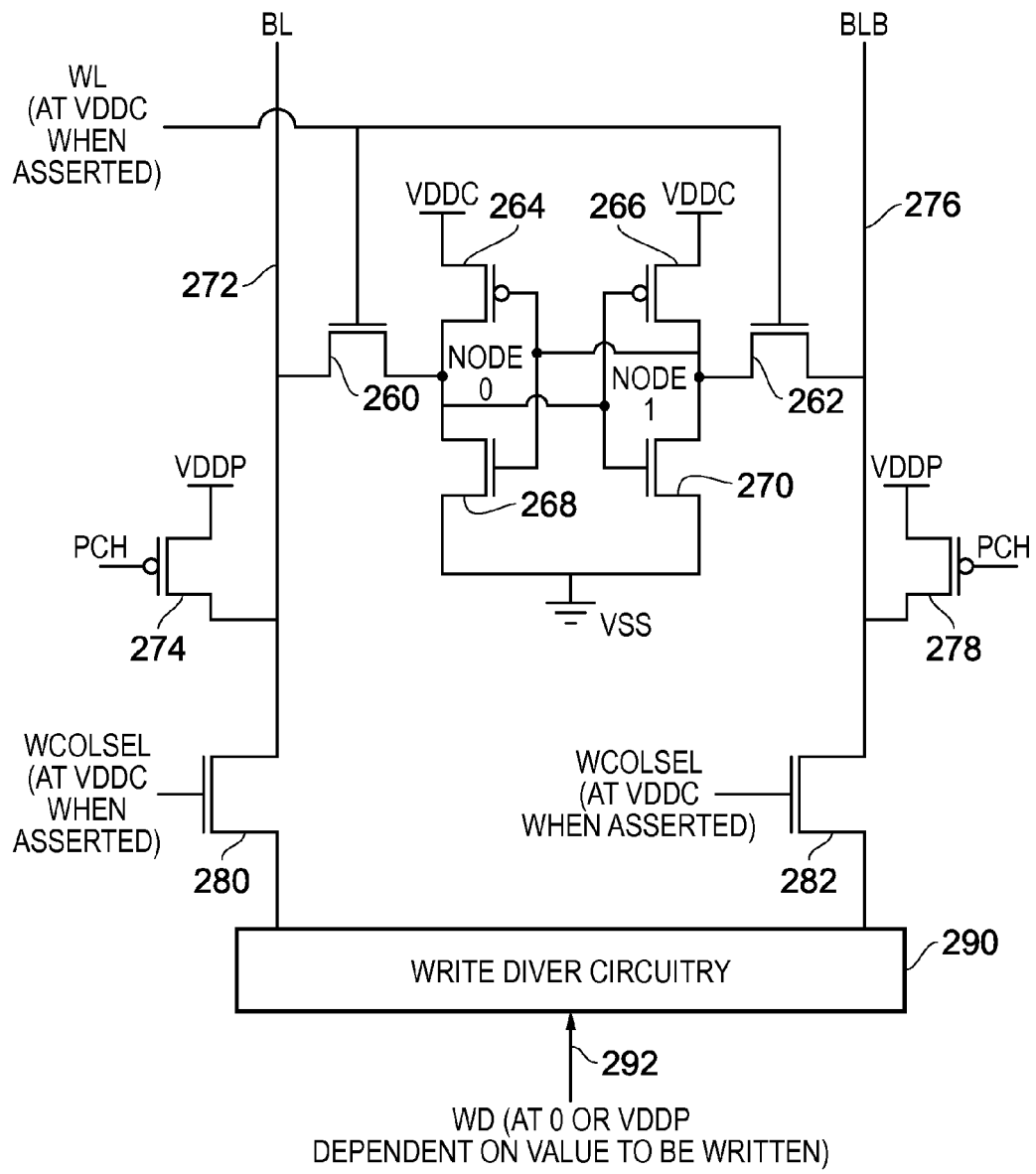
FIG. 4 illustrates certain components within the memory device used when performing a write operation in accordance with one embodiment.

FIG. 4 schematically illustrates how a write operation is performed in respect of a single addressed memory cell. In this example, the memory cell is a 6T SRAM memory cell consisting of two NMOS pass gates 260, 262 that are activated by a word line signal, and a storage element consisting of the PMOS transistors 264, 266 and NMOS transistors 268, 270. There are two internal nodes within the storage element, labelled as node zero and node one, and it will be appreciated that the data bit stored within the storage element is dependent on which of node zero or node one is at a logic one value (whichever node is at a logic one value, the other node will be at a logic zero value). The storage element is powered using the core voltage level VDDC in order to guarantee state retention within the memory cell.

Prior to a write operation being performed, the precharge circuitry formed from the two PMOS transistors 274, 278 will be activated by an asserted precharge signal at the logic zero level to precharge the bit lines BL and BLB to the peripheral voltage level VDDP.

During a write operation, the precharge signal will be deasserted and the word line signal will be asserted at the core voltage level VDDC in order to strongly turn on the pass gates 260, 262. In addition, the relevant write column select signal will be asserted at the core voltage level VDDC in order to strongly turn on the switch elements 280, 282 within the write column select circuitry 125, and hence couple the bit lines 272, 276 to the write driver circuitry 290. The write driver circuitry operates in the peripheral voltage domain and during the write operation will discharge the voltage on one of the bit lines 272, 276 dependent on the write data received over path 292 (which will either be at a zero voltage or the peripheral voltage dependent on the value to be written).

Figure 5:
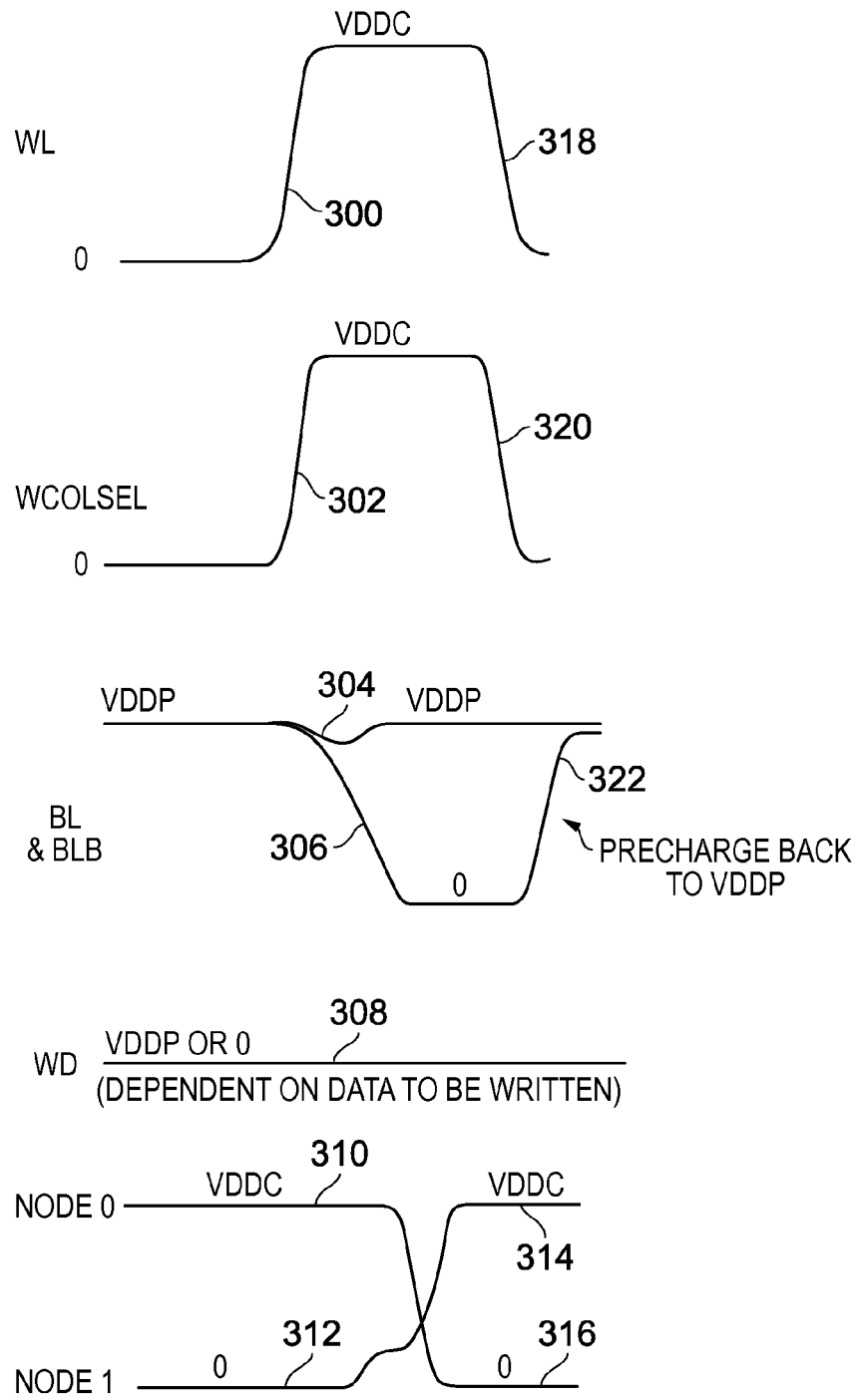
FIG. 5 schematically illustrates how the voltage levels change at various points within the circuitry of FIG. 4 in accordance with one embodiment.

FIG. 5 schematically illustrates how the voltages vary at various points within the circuitry of FIG. 4 in accordance with one embodiment. At the beginning of the write operation, the word line signal is asserted, causing the voltage on the word line to transition from the logic zero level to the core voltage level VDDC at point 300. A similar transition occurs on the write column signal at point 302, with again the voltage transitioning to the core voltage level VDDC. Thereafter, the write driver circuitry will selectively discharge the voltage on one of the bit lines 272, 276. At the start of this process, both bit lines will be at the peripheral voltage level VDDP. The bit line that is pulled down to logic zero level will have its voltage discharged as shown by the reference numeral 306. Due to coupling effects, there will often be an initial dip in the other bit line as shown by the reference numeral 304, but that bit line will then return to the VDDP level. The voltage on the write data line 292 will either be at the VDDP or the voltage zero level as shown by reference numeral 308, dependent on the data to be written.

In this example, it is assumed that the write data is going to flip the state of the storage element. At the start of the write operation, it assumed that node zero is at the core voltage level VDDC as shown by reference numeral 310, and that node one is at the zero voltage level, as shown by reference numeral 312. As the voltage on one of the bit lines is discharged towards the logic zero level, this causes the state of the internal nodes to flip as shown generally by the voltage changes illustrated in FIG. 5, such that at the end of the write operation the voltage on node one will at the VDDC voltage level as shown by the reference numeral 314, and the voltage on node zero will have changed to a zero voltage level, as shown by the reference numeral 316. At this point, the write operation is terminated by de-asserting the word line signal, as shown by the transition 318, and similarly de-asserting the write column select signal, as shown by the transition 320. At this point, the precharge transistors 274, 276 can be reactivated to begin precharging the discharged bit line back up to the VDDP voltage level, as shown by the reference numeral 322.

Figure 6:
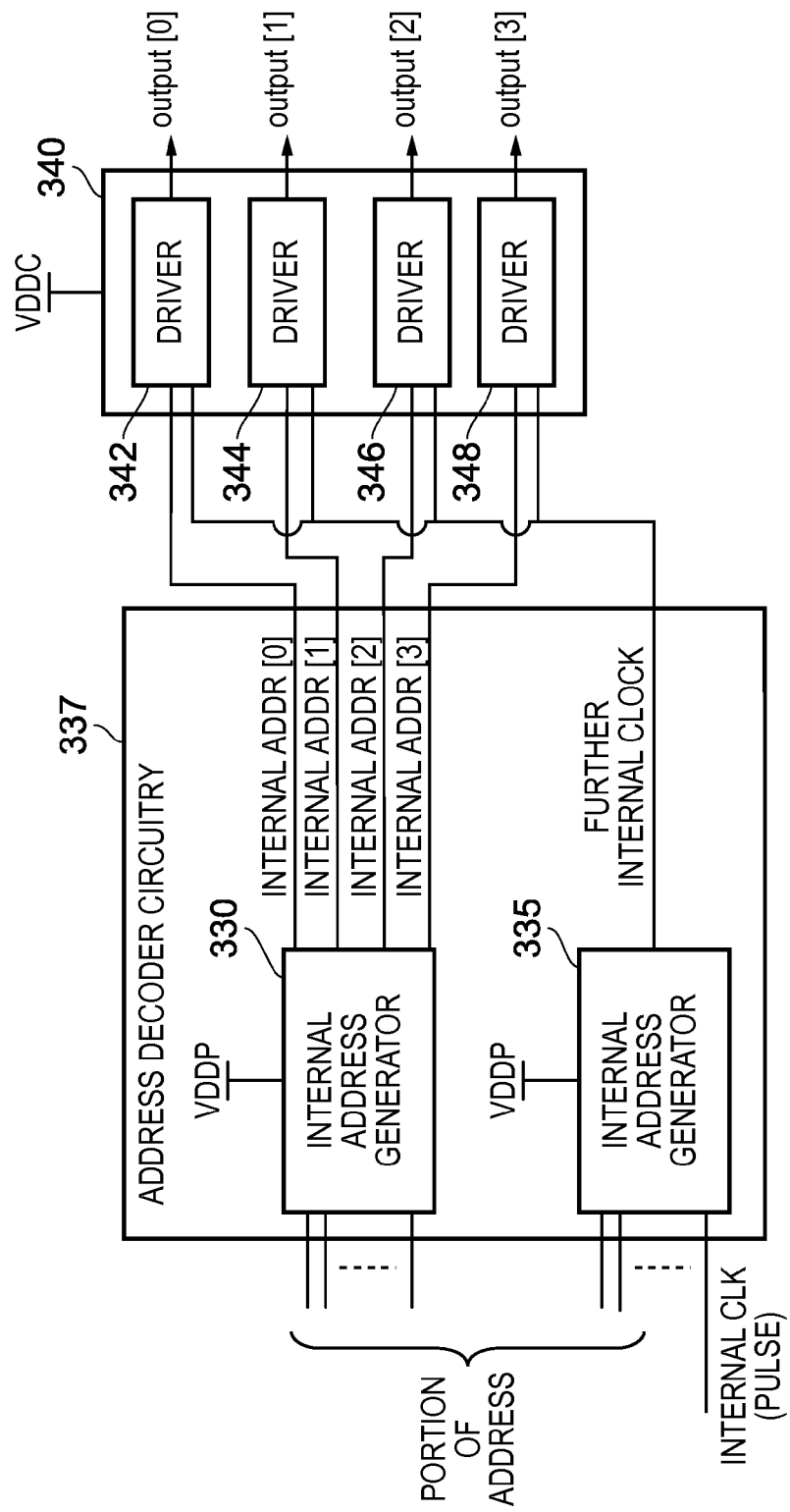
FIG. 6 schematically illustrates address decoding circuitry and associated driver circuitry in accordance with one embodiment.

FIG. 6 illustrates address decoder circuitry 337 and associated driver circuitry 340 that may be used in accordance with one embodiment. The address decoder circuitry 337 can be constructed in a variety of ways, but in this embodiment includes an internal address generator block 330 receiving a predetermined number of the bits of the address input to the control circuitry 110, and an internal clock generator block 335 which receives one or more bits of the address along with an internal clock signal having a particular pulse width, the internal clock signal being derived from the clock signal received by the control circuitry 110. The internal address generator 330 performs a predetermined logical operation on the received address bits in order to generate a plurality of internal address signals, each separate internal address signal being provided to a separate driver 342, 344, 346, 348 within the driver circuitry 340. Further, the internal clock generator 335 performs a logical operation based on the received signals in order to generate a further internal clock signal routed to each of the drivers 342, 344, 246, 348.

Each driver then performs a logical operation on the two received input signals in order to generate an output signal at either a logic zero or a logic one level. As shown in FIG. 6, the driver circuitry 340 operates from the core voltage level, and accordingly the output signals generated will be in the core voltage domain. In one particular embodiment, during any particular read or write operation, one of the drivers 342, 344, 346, 348 will assert its output signal at the VDDC voltage level, and all other drivers will output signals at a zero voltage level. Whilst the driver circuitry operates in the core voltage domain VDDC, the entirety of the address decoder circuitry 337 operates in the peripheral voltage domain, and hence the various input signals received by the driver circuitry 340 will be in the peripheral voltage domain, and will need shifting into the core voltage domain.

The general arrangement shown in FIG. 6 can be used to implement the write multiplexing driver circuitry that is configured to assert the write column select signals over path 150 to the write column select circuitry 125 of FIG. 2. For the four-way multiplexing option discussed earlier with reference to FIG. 3, the driver circuitry 340 will include four separate drivers as shown in FIG. 6, and each of the output signals will represent one of the write column select signals. In this instance, all of the circuitry shown in FIG. 6 resides within the control circuitry 110 of FIG. 2.

The general arrangement of circuitry shown in FIG. 6 can also be used to implement the word line driver circuits used to assert the word line signals over path 145. In this embodiment, the address decoder circuitry 337 may reside within the control circuitry 110, or at least a part of that address decoder circuitry may reside within the word line driver circuitry 140. The driver circuitry 340 will then reside within the word line driver circuitry 140 of FIG. 2.

As mentioned earlier, the driver circuitry 340 needs to incorporate some level shifting functionality in order to shift the input signals from the peripheral voltage domain, so that the output signals can be generated in the core voltage domain. In one embodiment, each driver 342 will assert its output at the logic one level (in the VDDC voltage domain) if both of its inputs are at a logic one level (in the peripheral voltage domain VDDP).

Figure 7A:
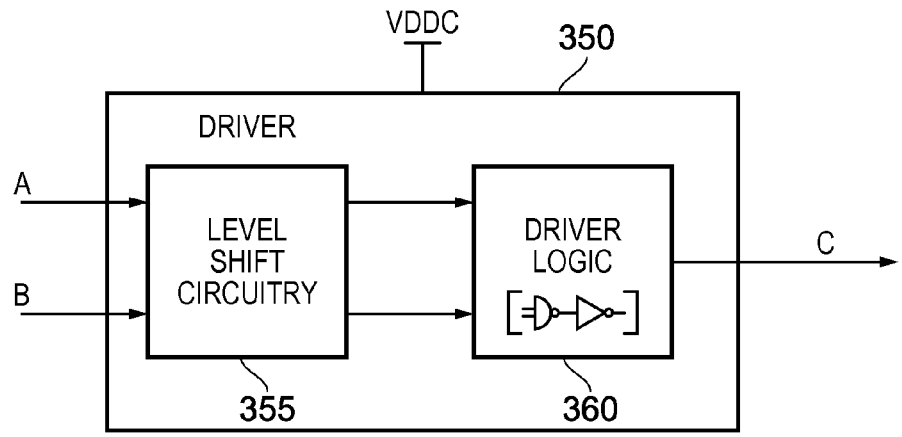
FIG. 7A illustrates a form of driver that may be used within the circuitry of FIG. 6 in accordance with one embodiment.

FIG. 7A illustrates one form of driver that can be used within each of the four driver blocks 342, 344, 346, 348 shown in FIG. 6. The two inputs (denoted as inputs A and B) in FIG. 7A are provided to dedicated level shifting circuitry 355, which converts those input signals into signals in the core voltage domain. The driver logic 360 can then perform the required logical operation in order to generate the output signal (denoted by the letter C in FIG. 7A) in the core voltage domain (at either a zero voltage or the VDDC voltage level dependent on the inputs A and B). In one embodiment, as shown schematically in FIG. 7A, the driver logic circuitry 360 performs a NAND operation on the inputs A and B, followed by an inverter operation (and hence the driver logic circuit 360 operates as an AND gate so that the output C is only asserted at a logic one level when both of the inputs are at the logic one level).

Figure 7B:
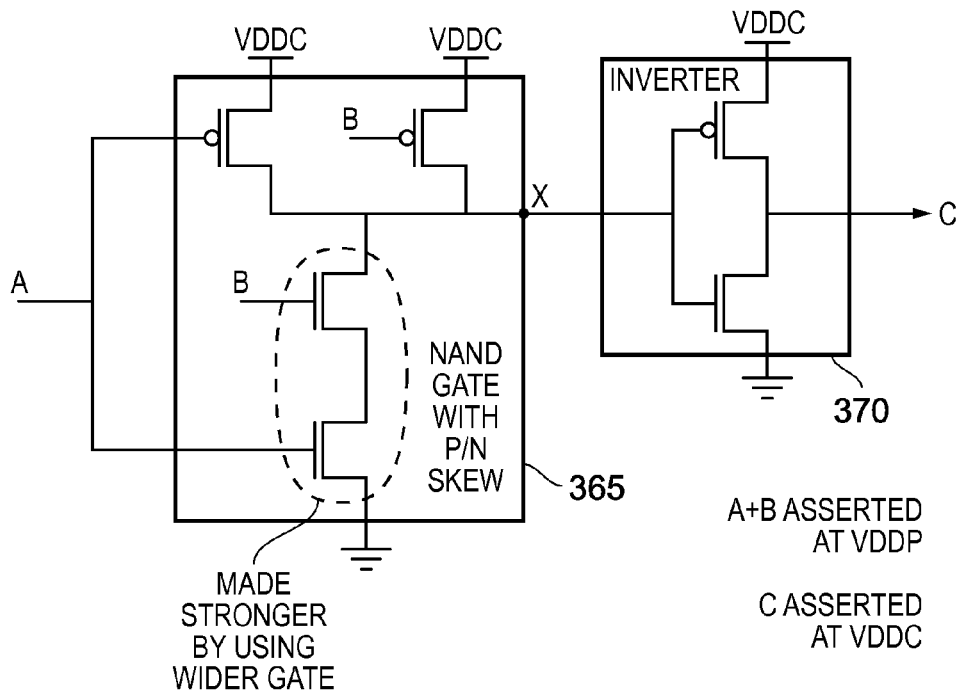
FIG. 7B illustrates a form of driver that may be used within the circuitry of FIG. 6 in accordance with an alternative embodiment.

Whilst an arrangement such as that shown in FIG. 7A can support large level shifting functions with no leakage current, the level shift circuitry 355 does occupy a relatively large area, and will consume power when performing the level shifting operations. In an alternative embodiment, the requirement for such a dedicated level shift circuitry can be avoided by applying a P/N skew process to the components forming the driver logic 360. This is illustrated schematically in FIG. 7B, where the transistors forming both the NAND gate 365 and the inverter 370 are illustrated. In this embodiment, the inputs A and B are received in the peripheral voltage domain. Accordingly, for the one driver that receives both inputs A and B at the logic one level, those inputs will only relatively weakly turn on the NMOS transistor pair coupling the output node to ground within the NAND gate 365. Further, the PMOS transistors of the NAND gate 365 will not be turned fully off, and hence will contribute some leakage current. However, this leakage current will only be present in the one driver circuit that is actually to assert a drive signal (whether that be a write column select drive signal or a word line drive signal).

The NAND gate is provided in the core voltage domain and accordingly, prior to the write operation taking place, the internal node X will be at the VDDC level by virtue of the PMOS transistors both being turned on. To ensure correct operation when asserting an output signal C within one of the drivers, it is important that the NMOS transistors with the NAND gate of that driver are sufficiently strongly turned on to discharge the internal node X towards the logic zero level during the write operation, so that the output of the inverter 370 flips from the logic zero level to the output level at the voltage level VDDC. This can be achieved by applying a P/N skew process to the transistor components within the NAND gate 365, and in particular by making the two NMOS transistors relatively strong compared to the PMOS transistors, for example by increasing the width of the gate within both of those NMOS transistors. It has been found that such a P/N skew process can be sufficient to support a level up voltage shift of approximately 400 mV, and accordingly can avoid the need for separate level shifting circuits.

Table 1 below illustrates some simulation results achieved for both a high performance memory cell array (HP1080) and a high current memory array (HC907), and contrasts the write margin (WRM) achieved when both the write column select signals and the word line drive signals are in the core voltage domain, as compared with a situation where only the word line drive signals are in the core voltage domain, and the write column select signals are retained in the peripheral voltage domain. As shown in the table, the above described scheme where both the word line drive signals and the write column select signals are asserted in the core voltage domain provides significantly more write margin. This is true even up to a voltage difference of 500 mV between the core voltage domain and the peripheral voltage domain. The data also shows that the use of the described techniques shows an improved and adequate yield compared with an approach where only the word line drive signals are asserted in the core voltage domain. Both write margin and write performance (write pulse-width) improve when using the above described techniques, due to the stronger write multiplexing function. For example, the write pulse width improves from 217 ps to 142 ps for the HP1080 bit cell when VDDC is at 0.935 volts and VDDP is at 0.535 volts.

As also shown by Table 2 below, the access disturb margin (ADM) associated with read operations also improves as the voltage difference improves between VDDC and VDDP, due to less bit line disturbance as VDDP is lower. As shown in Table 2, eventually there is a significant drop in the ADM value but only when the voltage difference reaches approximately 500 mV. At the anticipated useful voltage difference to be employed in many modern systems of approximately 400 mV, both good ADM and WRM can be achieved with improved write performance when both the word line drive signals and the write column select signals are asserted in the core voltage domain. Tables 1 and 2 are set out below:

TABLE 1

16FF Bitcell Write Margin Improvement with WL and WCOLSEL and Bitcell on VDDC

| | | HP1080 | | | | HC907 | | | |
|---|---|---|---|---|---|---|---|---|---|
| | | WCOLSEL = VDDP WL = VDDC | | WCOLSEL = VDDC WL = VDDC | | WCOLSEL = VDDP WL = VDDC | | WCOLSEL = VDDC WL = VDDC | |
| SFG/−40C, 128rpbl, LL, v0.1_2p1 | | 5.2 sigma WL | | 5.2 sigma WL | | 5.2 sigma WL | | 5.2 sigma WL | |
| VDDC (V) | VDDP (V) | DC WRM | width (ps) | DC WRM | width (ps) | DC WRM | width (ps) | DC WRM | width (ps) |
| 0.935 | 0.935 | 13.2 | 174 | 13.2 | 174 | 8.8 | 185 | 8.8 | 185 |
| 0.935 | 0.635 | 12.5 | 184 | 12.9 | 149 | 8.3 | 197 | 8.5 | 164 |
| 0.935 | 0.535 | 11 | 217 | 12.6 | 142 | 7.6 | 227 | 8.3 | 158 |
| 0.935 | 0.435 | 7.1 | 523 | 11.4 | 144 | 4.2 | Fail | 7.6 | 163 |
| 0.765 | 0.765 | 8.8 | 215 | 8.8 | 215 | 5.8 | 279 | 5.8 | 279 |
| 0.765 | 0.635 | 8.6 | 226 | 8.7 | 203 | 5.6 | 309 | 5.7 | 279 |
| 0.765 | 0.535 | 8.3 | 251 | 8.6 | 195 | 5.4 | 380 | 5.6 | 285 |
| 0.765 | 0.435 | 7 | 346 | 8.4 | 194 | 4.8 | Fail | 5.4 | 323 |

TABLE 2

16FF Bitcell ADM Improvement with WL and Bitcell on VDDC

FSG/125C,
256rpbl, LL,
v0.1_2p1

| VDDC (V) | VDDP (V) | HP1080 ADM | HC907 ADM |
|---|---|---|---|
| 0.935 | 0.935 | 8.1 | 7.5 |
| 0.935 | 0.835 | 8.4 | 7.7 |
| 0.935 | 0.735 | 8.9 | 8.1 |
| 0.935 | 0.635 | 9.7 | 8.7 |
| 0.935 | 0.535 | 18 | 15.4 |
| 0.935 | 0.435 | 2.9 | 2.3 |
| 0.765 | 0.765 | 7.7 | 6.87 |
| 0.765 | 0.635 | 8.1 | 7.18 |
| 0.765 | 0.535 | 8.67 | 7.6 |
| 0.765 | 0.435 | 15.9 | 13.28 |

Tables 3 and 4 below show equivalent data obtained for another type of bitcell:

TABLE 3

14LPe Bitcell Write Margin Improvement with WL and WCOLSEL and Bitcell on VDDC

| | | HD Bitcell, WCOLSEL = VDDP WL = VDDC | | HD Bitcell, WCOLSEL = VDDC WL = VDDC | |
|---|---|---|---|---|---|
| VDDC (V) | VDDP (V) | DC WRM (sigma) | 4.5 sigma wl_pulsewidth (ps) | DC WRM (sigma) | 4.5 sigma wl_pulsewidth (ps) |
| 1 | 1 | 6.3 | 190.5 | 6.3 | 190.5 |
| 1 | 0.9 | 6.1 | 209.8 | 6.2 | 188.3 |
| 1 | 0.8 | 5.8 | 245.2 | 6.1 | 188.7 |
| 1 | 0.7 | 4.6 | 392.3 | 6.0 | 196.0 |
| 1 | 0.6 | Fail | Fail | 5.8 | 227.3 |
| 1 | 0.5 | Fail | Fail | 4.1 | 3.885ns @ 4.1 sigma |
| VDDC (V) | VDDP (V) | DC WRM (sigma) | 3.0 sigma wl_pulsewidth (ps) | DC WRM (sigma) | 3.0 sigma wl_pulsewidth (ps) |
| 0.8 | 0.8 | 4.1 | 265.3 | 4.1 | 265.3 |
| 0.8 | 0.7 | 3.9 | 338.4 | 4.1 | 265.0 |
| 0.8 | 0.6 | 3.1 | 664.2 | 3.9 | 280.9 |
| 0.8 | 0.6 | fail | fail | 3.5 | 444.4 |

TABLE 4

14LPe Bitcell ADM Improvement with WL and Bitcell on VDDC

| VDDC (V) | VDDP (V) | HD Bitcell ADM (sigma) |
|---|---|---|
| 1 | 1 | 6.3 |
| 1 | 0.9 | 6.5 |
| 1 | 0.8 | 7.0 |
| 1 | 0.7 | 7.4 |
| 1 | 0.6 | 6.9 |
| 1 | 0.5 | Failed |
| 0.8 | 0.8 | 5.4 |
| 0.8 | 0.7 | 5.7 |
| 0.8 | 0.6 | 6.1 |
| 0.8 | 0.5 | 5.8 |

As can be seen from Table 3, in the 14LPe bitcell, when the voltage difference is 400 mV (VDDC=1V, VDDP=0.6V), the cell has a write margin of 5.8 sigma when the WCOLSEL signal is also coupled to VDDC, compared with a fail condition if the WCOLSEL signal is coupled to VDDP.

Figure 8:
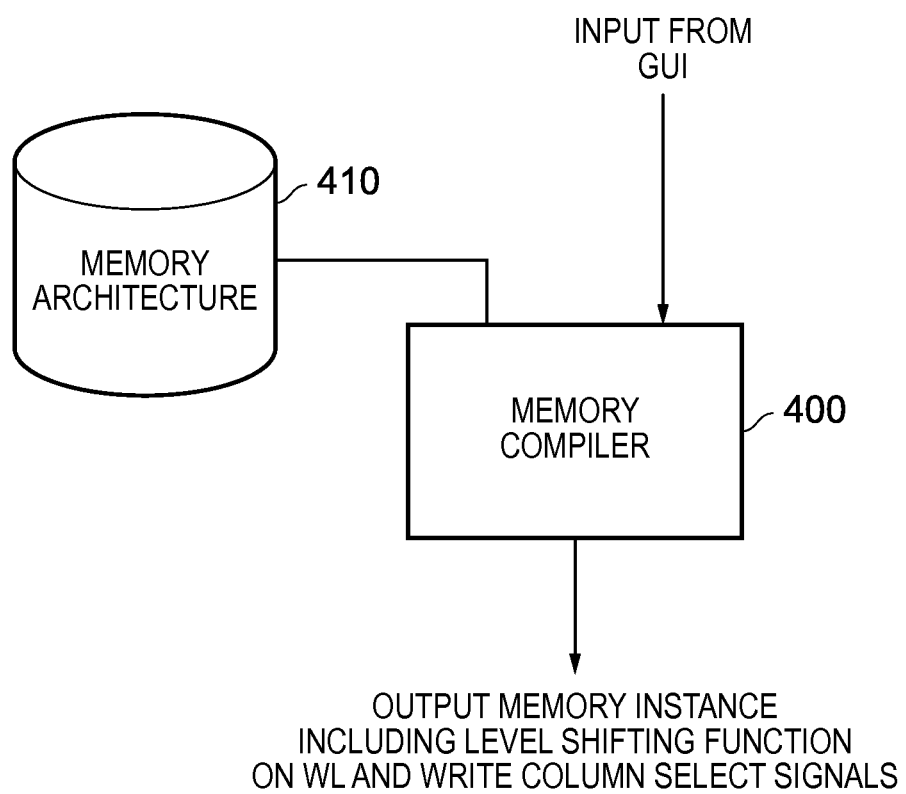
FIG. 8 is a diagram schematically illustrating the operation of a memory compiler to generate a memory instance including a level shifting function on the word line and write column select signals in accordance with the described embodiments.

FIG. 8 schematically illustrates how a memory instance including the above described level shifting functionality in respect of the word line signals and the write column select signals may be created from a memory compiler 400 with reference to a memory architecture 410. The memory architecture 410 specifies a definition of circuit elements and data defining rules for combining those circuit elements in order to create a memory instance. Particular requirements for the memory instance are entered into the memory compiler 400 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 400 then generates the required memory instance based on the input parameters and the memory architecture 410. In accordance with one embodiment, the memory compiler includes the above described level shifting functionality in respect of the word line signals and the write column select signals to ensure that the memory instance will have sufficient write margin, but keeps other control signals in the peripheral voltage domain to reduce power consumption.

Figure 9:
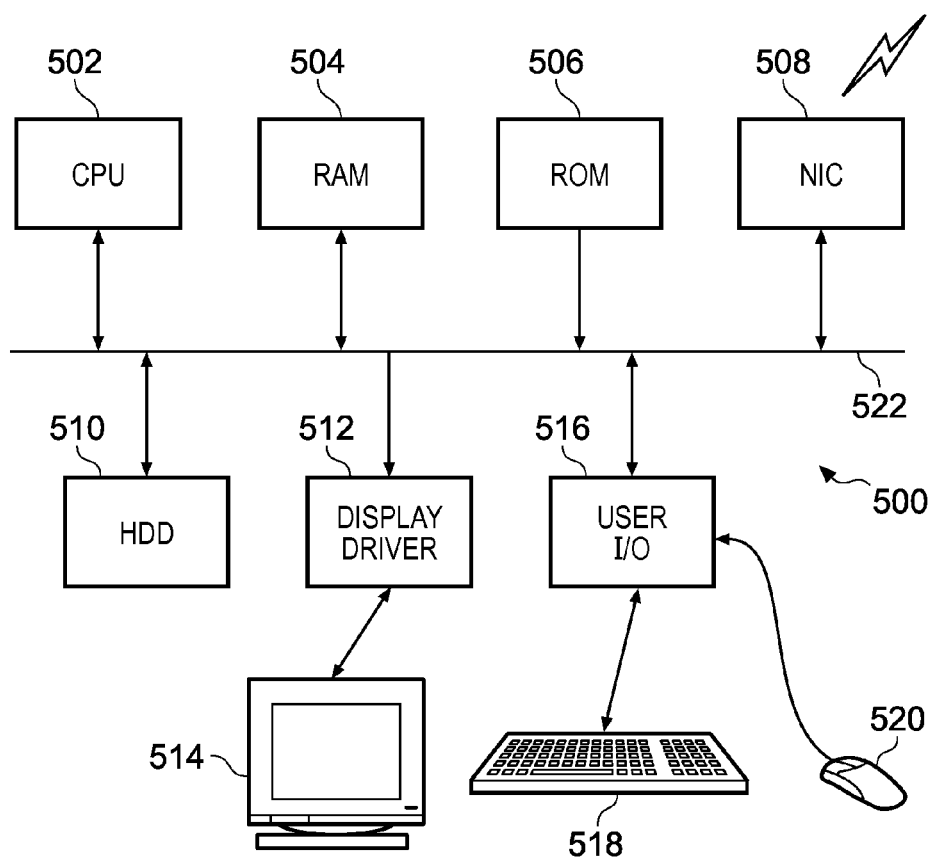
FIG. 9 is a diagram of a computer system on which a memory compiler operation may be performed to generate a memory instance conforming to the above described embodiments.

FIG. 9 schematically illustrates a general purpose computer 500 of the type that may be used to implement the above described memory compilation operation in order to generate a memory instance. The general purpose computer 500 includes a central processing unit 502, a random access memory 504, a read only memory 506, a network interface card 508, a hard disk drive 510, a display driver 512 and monitor 514 and a user input/output circuit 516 with a keyboard 518 and mouse 520 all connected via a common bus 522. In operation the central processing unit 502 will execute computer program instructions that may be stored in one or more of the random access memory 504, the read only memory 506 and the hard disk drive 510 or dynamically downloaded via the network interface card 508. The results of the processing performed may be displayed to a user via the display driver 512 and the monitor 514. User inputs for controlling the operation of the general purpose computer 500 may be received via the user input output circuit 516 from the keyboard 518 or the mouse 520 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 500. When operating under control of an appropriate computer program, the general purpose computer 500 can perform the above described memory compiler operation and can be considered to form an apparatus for performing the above described memory compiler operation. The architecture of the general purpose computer 500 could vary considerably and FIG. 9 is only one example.

From the above described embodiments, it will be appreciated that such embodiments enable write margin and write performance to be maintained in memory devices where the difference between the core voltage domain and the peripheral voltage domain is relatively large (for example of the order of 400 mV), whilst significantly reducing the power consumption in the memory device when compared with a memory device where all of the control signals from the access circuitry are level shifted to the core voltage domain. The above described techniques can hence result in memory devices occupying less area, having higher performance, and consuming less dynamic power than an equivalent memory device where a larger number of the control signals are level shifted, whilst ensuring sufficient write margin is achieved, and hence that write operations can be performed reliably.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory device comprising:
an array of memory cells connected to a core voltage level and arranged as a plurality of rows and columns, each row being connected to an associated word line, and each column being connected to an associated at least one bit line, the columns being arranged into a plurality of column groups, each column group containing a plurality of columns;
access circuitry configured to perform a write operation in order to write data into a plurality of addressed memory cells, said plurality of addressed memory cells comprising an addressed memory cell within each of a plurality of the column groups, the access circuitry being configured to receive both the core voltage level and a peripheral voltage level less than said core voltage level;
the access circuitry comprising:
word line driver circuitry configured to assert a word line signal at the core voltage level on the word line associated with a row of the array containing the plurality of addressed memory cells;
precharge circuitry configured to precharge, to said peripheral voltage level, the at least one bit line associated with at least each column containing an addressed memory cell, prior to said write operation being performed;
write driver circuitry configured to control the voltage on the at least one bit line of each of the addressed memory cells during the write operation in order to store write data into the plurality of addressed memory cells;
write multiplexing circuitry configured, during the write operation, to couple the at least one bit line of each addressed memory cell to the write driver circuitry, in dependence on a mux control signal identifying which column in each of said plurality of column groups contains the addressed memory cells; and
write multiplexing driver circuitry configured to assert said mux control signal to the write multiplexing circuitry at said core voltage level.

2. A memory device as claimed in claim 1, wherein said word line driver circuitry and the write multiplexing driver circuitry are the only components within the access circuitry configured to operate from the core voltage level.

3. A memory device as claimed in claim 1, wherein the write multiplexing driver circuitry includes level shifting circuitry used to convert at least one signal from the peripheral voltage level to the core voltage level in order to cause the asserted mux control signal to be at the core voltage level.

4. A memory device as claimed in claim 3, wherein the level shifting circuitry operates on at least one input signal to the write multiplexing driver circuitry in order to generate a corresponding at least one level shifted input signal, and the write multiplexing driver circuitry is configured to then generate the asserted mux control signal in dependence on said at least one level shifted input signal.

5. A memory device as claimed in claim 1, wherein the write multiplexing driver circuitry comprises at least one circuit component formed of both NMOS transistors and PMOS transistors, and a drive strength of one of the NMOS transistors and the PMOS transistors is skewed so as to enable the write multiplexing driver circuitry to level shift at least one signal from the peripheral voltage level to the core voltage level in order to cause the asserted mux control signal to be at the core voltage level.

6. A memory device as claimed in claim 5, wherein the write multiplexing driver circuitry includes a NAND circuit component and a P/N skew is incorporated within the NAND circuit component to increase the drive strength of the NMOS transistors relative to the PMOS transistors.

7. A memory device as claimed in claim 1, wherein the write multiplexing circuitry comprises, for each column group, switch circuitry configured to couple to the write driver circuitry the at least one bit line associated with one column in that column group.

8. A memory device as claimed in claim 7, wherein the switch circuitry comprises a switch element for each column within the column group, and the mux control signal generated by the write multiplexing driver circuitry comprises a separate mux control signal for each switch element, with one of the separate mux control signals being asserted at the core voltage level to turn on the associated switch element.

9. A memory device as claimed in claim 1, wherein the word line driver circuitry includes level shifting circuitry used to convert at least one signal from the peripheral voltage level to the core voltage level in order to cause the asserted word line signal to be at the core voltage level.

10. A memory device as claimed in claim 9, wherein the level shifting circuitry operates on at least one input signal to the word line driver circuitry in order to generate a corresponding at least one level shifted input signal, and the word line driver circuitry is configured to then generate the asserted word line signal in dependence on said at least one level shifted input signal.

11. A memory device as claimed in claim 1, wherein the word line driver circuitry comprises at least one circuit component formed of both NMOS transistors and PMOS transistors, and a drive strength of one of the NMOS transistors and the PMOS transistors is skewed so as to enable the word line driver circuitry to level shift at least one signal from the peripheral voltage level to the core voltage level in order to cause the asserted word line signal to be at the core voltage level.

12. A memory device as claimed in claim 11, wherein the word line driver circuitry includes a NAND circuit component and a P/N skew is incorporated within the NAND circuit component to increase the drive strength of the NMOS transistors relative to the PMOS transistors.

13. A memory device as claimed in claim 1, wherein operation of the precharge circuitry and the write driver circuitry is controlled by associated control signals switchable between a ground voltage level and said peripheral voltage level.

14. A memory device as claimed in claim 1, wherein:
each column is connected to a pair of bit lines; and
the write driver circuitry is configured to control the voltage on the pair of bit lines of each of the addressed memory cells during the write operation by maintaining one of the bit lines in said pair at the peripheral voltage level and discharging the voltage on the other of the bit lines in said pair.

15. A memory device as claimed in claim 1, wherein the access circuitry is further configured to perform a read operation in order to read data from a plurality of addressed memory cells, for said read operation the word line driver circuitry and the precharge circuitry operating in the same manner as for said write operation, the access circuitry further comprising:
sense amplifier circuitry configured to determine the data stored in the addressed memory cells by monitoring the voltage on the at least one bit line of each of the addressed memory cells during the read operation;
read multiplexing circuitry configured, during the read operation, to couple the at least one bit line of each addressed memory cell to the sense amplifier circuitry, in dependence on a read mux control signal identifying which column in each of said plurality of column groups contains the addressed memory cells; and
read multiplexing driver circuitry configured to assert said read mux control signal to the read multiplexing circuitry at said peripheral voltage level.

16. A memory device as claimed in claim 15, wherein operation of the precharge circuitry and the sense amplifier circuitry is controlled by associated control signals switchable between a ground voltage level and said peripheral voltage level.

17. A method of operating a memory device to perform a write operation, the memory device comprising an array of memory cells connected to a core voltage level and arranged as a plurality of rows and columns, each row being connected to an associated word line, and each column being connected to an associated at least one bit line, the columns being arranged into a plurality of column groups, each column group containing a plurality of columns, the method comprising:
employing access circuitry to perform the write operation in order to write data into a plurality of addressed memory cells, said plurality of addressed memory cells comprising an addressed memory cell within each of a plurality of the column groups, the access circuitry receiving both the core voltage level and a peripheral voltage level less than said core voltage level;
precharging, to said peripheral voltage level, the at least one bit line associated with at least each column containing an addressed memory cell, prior to said write operation being performed;
during the write operation causing the access circuitry to:
assert a word line signal at the core voltage level on the word line associated with a row of the array containing the plurality of addressed memory cells;
employ write driver circuitry to control the voltage on the at least one bit line of each of the addressed memory cells in order to store write data into the plurality of addressed memory cells;
couple the at least one bit line of each addressed memory cell to the write driver circuitry, in dependence on a mux control signal identifying which column in each of said plurality of column groups contains the addressed memory cells; and
assert said mux control signal to the write multiplexing circuitry at said core voltage level.

18. A memory device comprising:
an array of memory cell means connected to a core voltage level and arranged as a plurality of rows and columns, each row being connected to an associated word line means, and each column being connected to an associated at least one bit line means, the columns being arranged into a plurality of column groups, each column group containing a plurality of columns;
access means for performing a write operation in order to write data into a plurality of addressed memory cell means, said plurality of addressed memory cell means comprising an addressed memory cell means within each of a plurality of the column groups, the access means for receiving both the core voltage level and a peripheral voltage level less than said core voltage level;
the access means comprising:
word line driver means for asserting a word line signal at the core voltage level on the word line means associated with a row of the array containing the plurality of addressed memory cell means;
precharge means for precharging, to said peripheral voltage level, the at least one bit line means associated with at least each column containing an addressed memory cell means, prior to said write operation being performed;
write driver means for controlling the voltage on the at least one bit line means of each of the addressed memory cell means during the write operation in order to store write data into the plurality of addressed memory cell means;
write multiplexing means for coupling, during the write operation, the at least one bit line means of each addressed memory cell means to the write driver means, in dependence on a mux control signal identifying which column in each of said plurality of column groups contains the addressed memory cell means; and write multiplexing driver means for asserting said mux control signal to the write multiplexing means at said core voltage level.

19. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

* * * * *